United States Patent [19]

Durov et al.

[11] Patent Number: 4,471,301

[45] Date of Patent: Sep. 11, 1984

[54] DEVICE FOR MONITORING THYRISTORS OF HIGH-VOLTAGE VALVE

[75] Inventors: Jury N. Durov; Nikolai A. Fomin; Rem A. Lytaev; Arkady I. Yanvarev; Tamara I. Ivannikova, all of Moscow, U.S.S.R.

[73] Assignee: Vsesojuzny Elektrotekhnichesky Institut, Moscow, U.S.S.R.

[21] Appl. No.: 329,823

[22] Filed: Dec. 11, 1981

[51] Int. Cl.³ .................... G01R 25/00; G01R 31/22
[52] U.S. Cl. ............................. 324/158 SC; 324/96; 324/158 D; 340/645
[58] Field of Search ............ 324/158 SC, 158 D, 96; 340/645

[56] References Cited

U.S. PATENT DOCUMENTS

| | | | |
|---|---|---|---|
| 3,200,392 | 8/1965 | Chumakov | 340/645 |
| 3,238,520 | 3/1966 | Van Vlodrop | 340/645 |
| 3,461,384 | 8/1969 | Bayati et al. | 324/96 |
| 3,794,908 | 2/1974 | Lindblom et al. | 340/645 |
| 4,025,845 | 5/1977 | Lhommelet et al. | 324/96 |

Primary Examiner—Stewart J. Levy
Attorney, Agent, or Firm—Burgess, Ryan & Wayne

[57] ABSTRACT

A device for monitoring thyristors of a high-voltage valve comprises thyristor voltage detectors coupled via light guides to a buffer storage unit through a selector. Also provided are an OR gate assembly, an adder, a memory unit, and a comparison unit, which are placed in series and coupled to a control unit. The OR gate assembly is connected to the buffer storage unit which is also coupled to the control unit. A second input of the comparison unit is connected to a second output of the adder, while its output is connected to an indicator signalling the quantity of disabled thyristors and to a unit protecting the high-voltage valve against breakdown. The selector is also connected to an indicator signalling the numbers of disabled thyristors.

7 Claims, 4 Drawing Figures

DEVICE FOR MONITORING THYRISTORS OF HIGH-VOLTAGE VALVE

FIELD OF THE INVENTION

The present invention relates to high-voltage conversion equipment and in particular to a device for monitoring thyristors of a high-voltage valve.

The invention may be used for monitoring various components of high-voltage apparatus, more specifically, for monitoring thyristors of a high-voltage valve used for HVDC transmission.

PRIOR ART

High-voltage values are known to include a fairly large number of series-connected thyristors. Failure of a certain number of the thyristors may render the valve unserviceable. To enhance reliability, high-voltage valve comprise more thyristors than is actually needed in operation. There is still a probability that the number of disabled thyristors may, at a certain stage in operation, exceed the number of the additional thyristors. To prevent failure and also any condition that might cause it, the high-voltage valve is provided with a devide for monitoring thyristors, which is capable of furnishing an alarm signal and, as the number of disabled thyristors increases, a command to turn off the high-voltage valve.

High reliability and adequate noise immunity constitute the basic requirements for a thyristor tester since failure of a high-voltage valve or its turn-off without due reason may cause disconnection of loads or a fault in the power supply system.

Known in the art is a device for monitoring thryristors of a high-voltage rectifier (cf. FRG Pat. No. 1,941,989), whic comprises two probes installed in a manner allowing their movement along guides. The guides mount electrical contacts connected to anodes and cathodes of the thyristors. The leads of the probes are connected to an indicator signalling serviceable condition of the thyristors. When the thyristors are checked for condition, the probes moving along the guides are connected to the anodes and cathodes of the thyristors under test. The indicator will then signal the condition of the thyristors.

The high-voltage valve must be turned off before checking the thyristors for condition. In the known device no information is available on the condition of thyristors while a high-voltage valve is in operation, which is an apparent disadvantage since between scheduled checks the number of disabled thyristors may exceed the number of additional thyristors. Thus, failure of the high-voltage valve may result. So, the aforesaid device does not allow checking condition of thyristors while a high-voltage valve is in operation.

Also known in the art is a device for continuously monitoring thyristors (cf. Swedish Pat. No. 336,749) comprising a first resistor placed in parallel with all the thyristors comprised in a high-voltage valve, and a second resistor placed in parallel with one of the thyristors (reference thyristor). The resistors are connected in series with rectifier cells whose leads are connected to a measuring instrument and/or an electronic amplifier. As any of the thyristors fails, the instrument pointer deflects, the amount of deflection being proportional to the number of disabled thyristors. The electronic amplifier furnishes a signal to a signalling and protection circuit.

The foregoing device has low reliability and inadequate accuracy in determining the number of disabled thyristors due to the fact that voltage is unequally divided among the thyristors comrised in the high-voltage valve. Furthermore, the device is rendered completely unserviceable when the reference thyristor fails. Another disadvantage of the device is that it furnishes no information as to which of the thyristors has failed.

Another known device for monitoring thyristors of a high-voltage rectifier comprises voltage detectors whose number corresponds to the number of thyristors, said voltage detectors connected via light guides to the inputs of a unit converting light signals into electrical signals, the output of which is electrically coupled to the input of a buffer storage unit whose inverting output is, in turn, electrically coupled to an indicator signalling the quantity of disabled thyristors and to a unit protecting the high-voltage valve against breakdown, the device being also provided with a selector electrically coupled to the unit converting light signals into electrical signals, an address input of said selector being connected to a control unit, while its output is connected to an indicator signalling the numbers of disabled thyristors (cf. Swedish Pat. No. 365,915).

In the afore-mentioned device the outputs of the buffer storage unit are connected to the selector and a reset input is coupled to a respective output of the control unit. The device also includes an indicator control pulse shaper connected to the inputs of the indicator signalling the quantity of disabled thyristors and an indicator signalling the numbers of disabled thyristors. Pulses furnished by the voltage generators employing thyristors are fed through light guides to the components of the memory unit to be stored. The selector is used to transmit signals from the memory unit to the indicators in the form of narrow pulses.

The signals are transmitted successively without any checks made. Moreover, the correctness of the data obtained is not confirmed. Failure of the device causing faults in the power supply system may not be detected in time. Besides, the aforesaid device has inadequate noise immunity since it is designed for use at a d-c conversion substation wherein the noise level is fairly high. Failure or spurious response of the device processing the information as a sequence of narrow pulses will distort the results. Furthermore, the foregoing device supplies false information, say that all the thyristors are broken down when in emergency the voltage at the valves equals zero for a short time.

BRIEF DESCRIPTION OF THE INVENTION

It is an object of the present invention to provide a device for monitoring thyristors of a high-voltage valve featuring high reliability in determining the number of disabled thyristors.

The foregoing object is accomplished by that in a device for monitoring thyristors of a high-voltage valve comprising voltage detectors whose number corresponds to the number of thyristors, said voltage detectors being connected via light guides to the inputs of a unit converting light signals into electrical signals, the output of said unit being electrically coupled to a buffer storage unit whose inverting output is, in turn, electrically coupled to an indicator signalling the quantity of disabled thyristors and to a unit for protecting the high-voltage valve against breakdown, and also a selector electrically coupled to the unit converting light signals into electrical signals, an address input of said selector being connected to the control unit, while its output is connected to the indicator signalling the numbers of disabled thyristors, according to the invention, the input of the selector is connected to the output of the unit converting light signals into electrical signals, while its output is coupled to the input of the buffer storage unit, the device being also provided with an OR gate assembly having its input connected to a respective output of the buffer storage unit and its output coupled to a data input of the indicator signalling the numbers of disabled thyristors, an adder whose input is connected to the output of the OR gate assembly, a memory unit having its inputs connected respectively to the output of the adder and to the outputs of the control unit and its output coupled to a second input of the OR gate assembly, a comparison unit having its inputs connected respectively to a second output of the adder and to an address read output of the memory unit and its output coupled to the indicator signalling the quantity of disabled thyristors and to the unit protecting the high-voltage valve against breakdown.

Advantageously the device includes a unit for checking recorded information, the inputs of which are connected respectively to the output of the indicator signalling the quantity of disabled thyristors and to the output of the unit protecting the high-voltage valve against breakdown, while its output is coupled to the control input of the control unit and to the control input of the unit protecting the high-voltage valve against breakdown.

Desirably the device incorporates an additional comparison unit having its input connected to the output of the adder and its output coupled to the reset input of the adder.

Preferably the adder represents a combination adder having N stages, each of which includes a series of main and additional elementary adders, n inputs of which act as one-bit inputs of the combination adder, S-outputs of the main and additional adders of the first stage being connected to the inputs of the additional elementary adders of the same stage, one S-output of the additional adder of each stage serving as the output of the combination adder, while a P-output of each stage and subsequent stages is connected to the inputs of the main elementary adders of the next stage, the last stage comprising one elementary adder, the P- and S-outputs of which act as the outputs of the combination adder, the adder being also provided with a code converter having its inputs connected to the outputs of the combination adder, and a storage cell composed of flip-flops whose number corresponds to the number of the stages, J- and K-inputs of said flip-flops being connected to paraphase outputs of the code converter, C-inputs of the flip-flops being combined and acting as the control input of the adder, a Q-output of each flip-flop being connected to the input of the elementary adder of the stage corresponding to the flip-flop bit and acting as the output of the adder, a counter having one count input connected to the carry output of the code converter, while its second count input is combined with the C-inputs of the flip-flops, the outputs thereof serving as the adder outputs, and an OR gate having its inputs connected to the control unit and to the output of the additional comparison unit and its output coupled to the reset inputs of the flip-flops and the counter.

It is of advantage that the memory unit should include such series-connected components as a write selector, a storage assembly, and a read selector, data outputs of the read selector being connected to second inputs of the OR gates comprised in the gate assembly.

Preferably the comparison unit incorporates such series-connected components as a comparison circuit and an AND gate assembly, first inputs of each of said gates being connected to a respective address output of the read selector of the memory unit, the input of the comparison circuit being coupled to the output of the combination adder.

Advantageously the indicator signalling the numbers of disabled thyristors comprises a group of AND gates whose first inputs are connected to the outputs of the OR gate assembly, a register connected via its outputs to the outputs of the AND gates, a light indicator having its inputs connected to the outputs of the register, a clear pulse shaper having its input connected to second inputs of the AND gates and its output coupled to the reset input of the register, a comparison circuit having its first inputs connected to the address outputs of the selector and its output coupled to second inputs of the AND gates, and a unit for setting the address of the thyristors under test, the outputs of said unit being connected to second inputs of the comparison circuit.

In the device forming the subject of the present invention connection of the selector to the output of the unit converting light signals into electrical signals and to the buffer storage unit permits reducing the number of storage cells whose noise immunity is low as compared with combination circuits. A lesser number of storage cells in the thyristor interrogation circuits allows increasing noise immunity and operational reliability of the device. The inclusion of gates prevents the use of another adder whereby the operational reliability of the device will be increased. The use of the adder makes it possible to count disabled thyristors. The calculation is based on information obtained by the use of non-position code and the result is in the binary-decimal code. This permits counting the number of disabled thyristors using highly reliable computing elements known in the art, a feature enhancing operational reliability of the device. The use of a memory unit permits repeated survey of thyristors comprised in a rectifier and statistical processing of the data obtained, say by applying polling techniques, a factor increasing operational reliability of the device. The provision of a comparison unit makes it possible to reject data obtained due to spurious response of the device, say spurious response of thyristor voltage detectors, which is another factor increasing reliability. The utilization of a unit for checking recorded information makes it possible to ascertain the correctness of records in storage registers of an indicator signalling the quantity of disabled thyristors and a unit protecting a valve against breakdown. The unit for checking recorded information also precludes spurious response of the protection unit when the device fails or functions improperly, which enhances reliability. The use of an additional comparison unit makes it possible to perform a reset operation in the event of false failure of the whole group of detectors.

BRIEF DESCRIPTION OF DRAWINGS

The invention will now be described further with reference to specific embodiments thereof, taken in conjunction with the accompanying drawings, wherein.

DETAILED DESCRIPTION OF THE INVENTION

Figure 1:
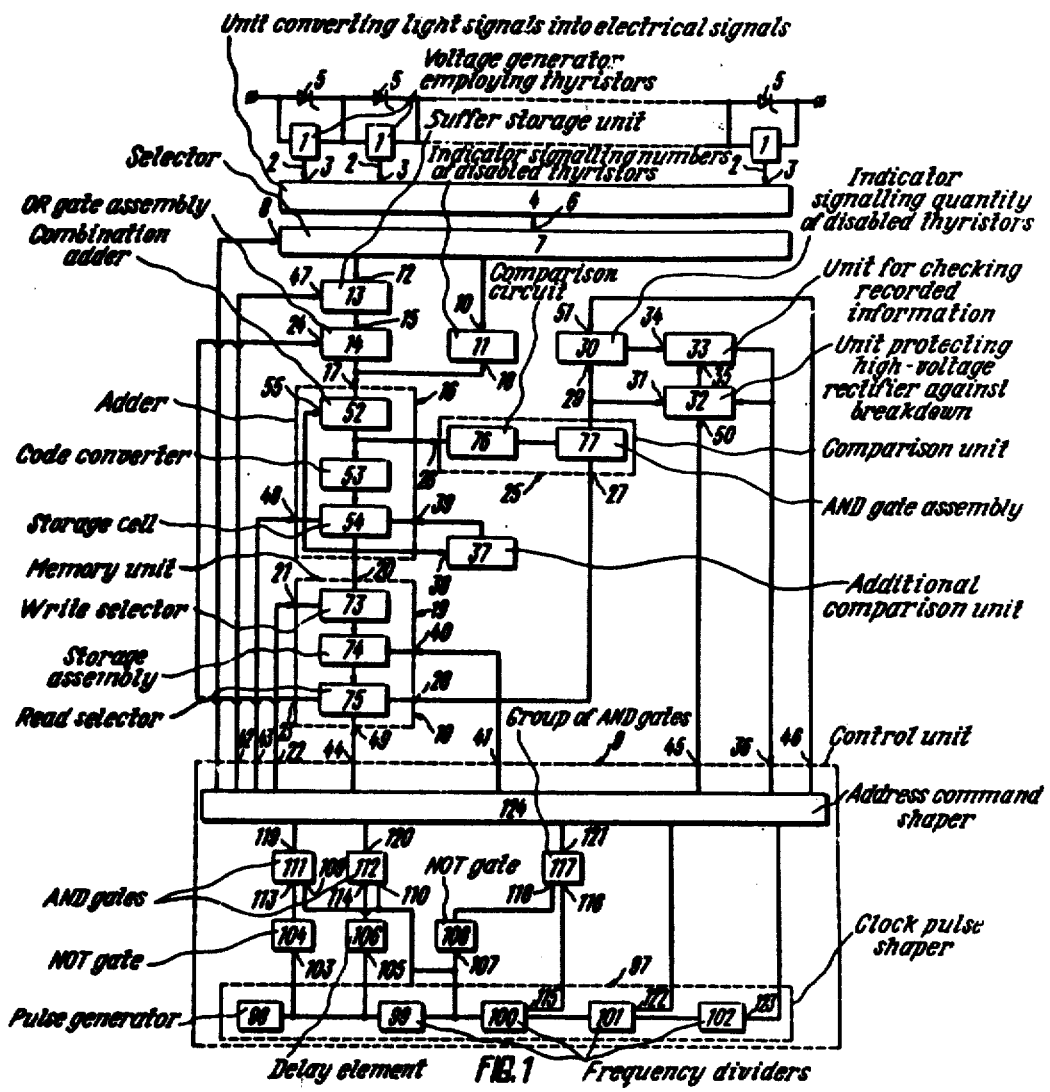
FIG. 1 is a block diagram of a device for monitoring thyristors of a high-voltage valve according to the invention.

Referring to the drawings the device for monitoring thyristors of a high-voltage valve comprises thyristor voltage detectors 1 (FIG. 1) connected via light guides 2 to inputs 3 of a unit 4 converting light signals into electrical signals. The thyristor voltage detector 1 represents a transducer converting voltage across a thyristor 5 into a corresponding light signal. The number of the detectors 1 is determined by the number of the thyristors 5 comprised in the high-voltage valve, each detector 1 being electrically coupled to the anode and cathode of the respective thyristor 5.

The multichannel output of the unit 4 converting light signals into electrical signals is connected to an input 6 of a selector 7 whose address input 8 is coupled to the output of a control unit 9. The number of the channels comprised in the unit 4 is determined by the number of the thyristor voltage detectors 1 coupled thereto. The address output of the selector 7 is connected to an address input 10 of an indicator 11 signalling the numbers of disabled thyristors. The data output of the selector 7 is connected to an input 12 of a buffer storage unit 13.

To check a high-voltage valve comprising in the herein described modification 256 thyristors, the selector 7 includes 12 address buses.

The device forming the subject of the present invention also incorporates an OR gate assembly 14 whose input 15 is connected to a respective output of the buffer storage unit 13 and an adder 16 whose input 17 is coupled to the output of the OR gate assembly 14. The output of the assembly 14 is also connected to a data input 18 of the indicator 11 signalling the numbers of disabled thyristors. Also provided are a memory unit 19 having its inputs 20, 21 connected respectively to the output of the adder 16 and to an output 22 of the control unit 9 and its output 23 coupled to a second input 24 of the OR gate assembly 14, and a comparison unit 25 having its inputs 26, 27 connected respectively to the second output of the adder 16 and to an address read output 28 of the memory unit 19 and its output coupled to an input 29 of an indicator 30 signalling the quantity of disabled thyristors and to an input 31 of a unit 32 protecting the high-voltage valve against breakdown.

To check reliability of conveyed information as to the quantity of disabled thyristors, the device in compliance with the invention comprises a unit 33 for checking recorded information, inputs 34 and 35 of which are connected respectively to the output of the indicator 30 signalling the quantity of disabled thyristors and to the output of the unit 32 protecting the high-voltage valve against breakdown, while the output thereof is coupled to a control input 36 of the control unit 9 and to the control input of the unit 32 protecting the high-voltage valve against breakdown.

To preclude spurious response of the device in the event of a short in the high-voltage valve circuit or when voltage across its terminals is reduced to a value preventing delivery of signals from the detectors 1, provision is made for an additional comparison unit 37 whose input 38 is connected to the output of the adder 16, while the output thereof is coupled to a set input 39 of the adder 16.

Figure 2:
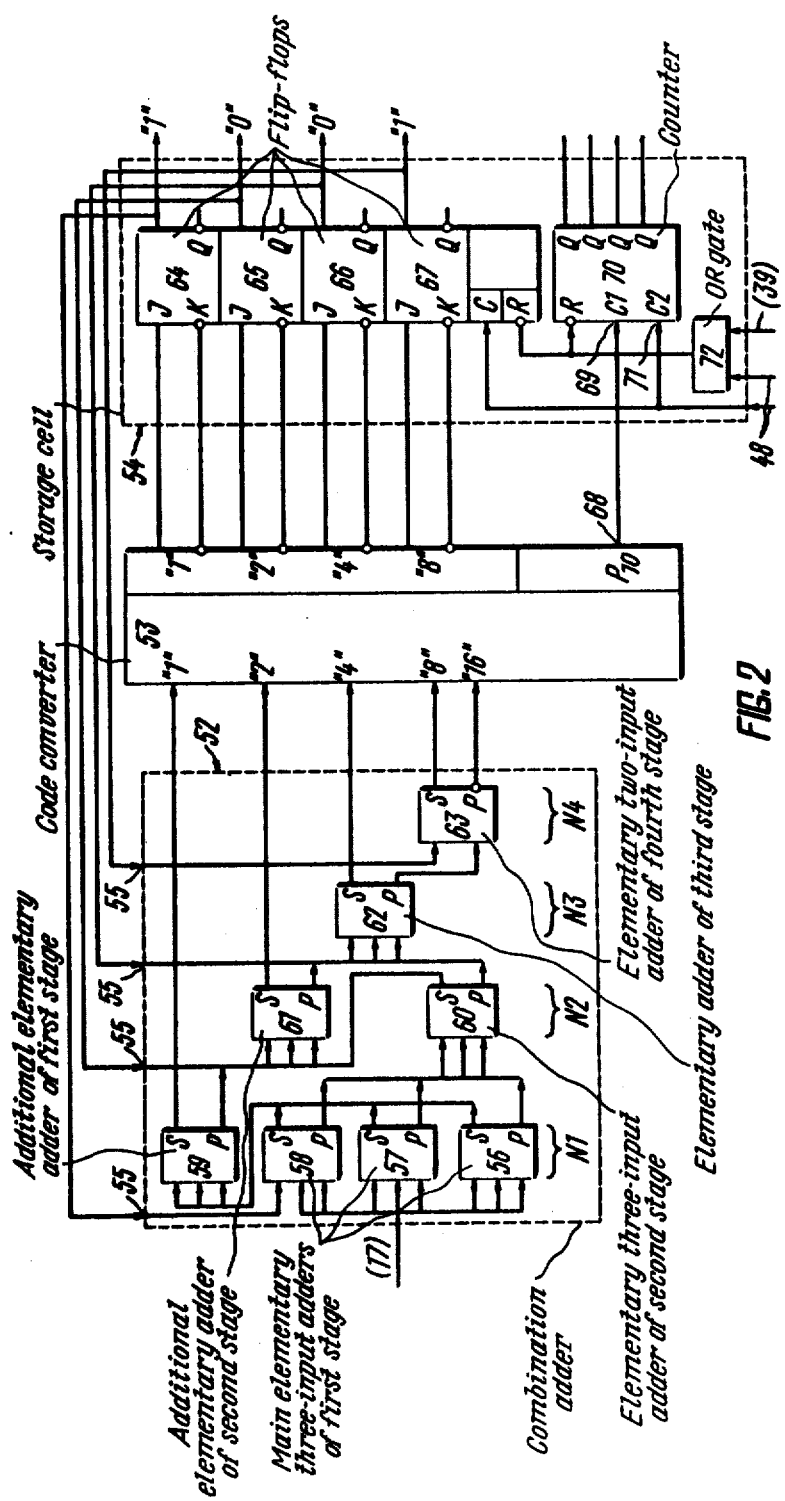
FIG. 2 is a block diagram of an adder comprised in the device according to the invention.

A reset input 40 of the memory unit 19 is connected to an output 41 of the control unit 9. Outputs 42, 43, 44, 45, and 46 of the control unit 9 are connected respectively to a reset input 47 of the buffer storage unit 13 to a control input 48 of the adder 16, to a control input 49 of the memory unit 19, to a reset input 50 of the unit 32 protecting the high-voltage valve against breakdown, and to a reset input 51 of the indicator 30 signalling the quantity of disabled thyristors, In the preferred embodiment of the invention the adder 16 comprises such series-connected components as a combination adder 52, a code converter 53, and a storage cell 54. The output of the storage cell 54 is connected to a multi-bit input 55 of the combination adder 52. The combination adder 52 (FIG. 2) has N stages, where N is 4.

The first stage $N_1$ includes four elementary adders 56, 57, 58, 59, three of which are main adders, while the adder 59 is an additional adder; the second stage $N_2$ includes two elementary three-input adders (a main adder 60 and an additional adder 61); the third stage $N_3$ comprises one elementary three-input adder 62 acting as a main adder; and the fourth stage $N_4$ comprises a two-input adder 63. Eight inputs of the elementary adders 56, 57, and 58 serve as the input 17 of the combination adder 52, while one of the inputs of the elementary adder 58 acts as the first-bit input of the multi-bit input 55. S-outputs of the adders 56, 57, and 58 are coupled to the inputs of the elementary adder 59, while P-outputs thereof are coupled to the inputs of the elementary adder 60. One of the inputs of the elementary adder 61 acts as the second-bit input of the multi-bit input 55, while the two other inputs are connected to the P-output of the elementary adder 59 and to the S-output of the elementary adder 62. One of the inputs of the elementary adder 62 serves as the third-bit input of the multi-bit input 55, and the two other inputs are connected to the P-outputs of the elementary adders 60 and 61. One input of the elementary adder 63 serves as the fourth-bit input of the multi-bit input 55, while the other input is connected to the P-output of the elementary adder 62.

The code converter 53 employing widely known linear decoder circuitry is designed to convert a binary number code into a binary-decimal code. The conversion process involves separation of a decimal carry signal if the lower-digit sum at a given moment is equal to or exceeds ten. For example, the figure 12 in the binary code is written as 1100 whereby 0010 and a carry signal appear at the output of the converter 53.

The S-outputs of the elementary adders 59, 61, 62, and 63 and the P-output of the adder 63 are connected to the inputs of the code converter 53 whose outputs is connected to the storage cell 54. The paraphase lower-digit outputs of the code converter 53 are connected to the J- and K-inputs of flip-flops 64, 65, 66, and 67 having a common control C-input and a reset R-input, which serve as the input 48 of the adder 16.

An output 68 of the code converter 53 furnishing a carry signal is connected to a count input 69 of a counter 70 which is part of the storage cell 54. A second count input 71 of the counter 70 is combined with the control C-input of J-K flip-flops 64, 65, 66, and 67. The reset R-input of the counter 70 is combined with the reset R-input of the J-K flip-flops 64 through 67 and connected to the output of an OR gate 72, one of its inputs serving as the input 39 of the adder 16, while the other input acts as the second-bit input of the two-bit input 48.

The Q-outputs of the flip-flops 64 through 67 are connected respectively to the first-, second-, third-, and fourth-bit inputs of the multi-bit input 55 of the combination adder 52. The Q-outputs of the J-K flip-flops 64 through 67 and the Q-outputs of the counter 70 serve as the output of the adder 16.

The memory unit 19 (FIG. 1) comprises a write selector 73 whose multi-bit input serves as the input 20 of the unit. The number of bits of the multi-bit input is conditioned by the code in processing data in the adder 16. The use of the binary-decimal code is optimum since two decimal digits as a whole represent an eight-bit computer syllable (byte) which is the primary unit of most of the prrsent-day microprocessor systems.

The memory unit 19 also incorporates a storage assembly 74 and a read selector 75 connected in series with the selector 73.

The number of the multi-bit inputs of the storage assembly 74 is determined by the number of registers contained in the assembly 74 and is chosen to provide sufficient averaging at which spurious response of the valve does not influence the data obtained during its serviceability check. In the preferred embodiment of the invention the number of the registers (not shown in FIG. 1) in the assembly 74 is eight. The control input of the write selector 73 acts as the control input 21 of the memory unit 19. In the preferred embodiment of the invention the write selector 73, the assembly 74, and the read selector 75 use widely known circuitry (cf. Branka Souček "Microprocessors and Microcomputers", USA, 1976, p. 38 and "The Manual on Integrated Microcircuits" edited by Tarabrin A. S., Moscow, the Energia Publishers, 1980, p. 340.

Figure 3:
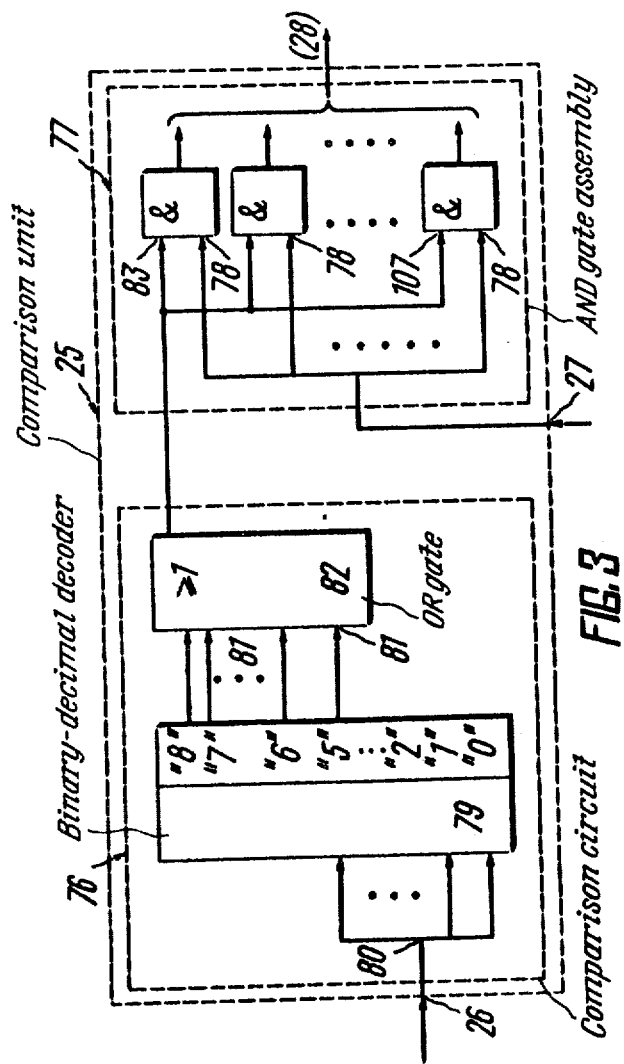
FIG. 3 depicts circuitry of a comparison unit comprised in the device according to the invention.

The comparison unit 25 (FIG. 3) includes such series-connected components as a comparison circuit 76 and an AND gate assembly 77. The first inputs of the AND gates act as the input 27 of the unit connected to the address outputs 28 of the read selector 75. The comparison circuit 76 contains a binary-decimal decoder 79 whose multi-bit input 80 serves as the input 26 of the unit 25 and is connected to the output of the combination adder 52. The outputs of the binary-decimal decoder 79 corresponding to digits "5", "6", "7", "8" used to shape a comparison signal are connected to inputs 81 of a multi-input OR gate 82. The output of said gate is connected to second inputs 83 of the AND gates.

The indicator 11 (FIG. 4) signalling the numbers of disabled thyristors contains a group of AND gates 84 having their first inputs connected to the outputs of the OR gate assembly 14 and their outputs coupled to asynchronous inputs 85 of a register 86. The outputs of the register 86 are connected to inputs 87 of a light indicator 88 (set of light-emitting diodes in the preferred embodiment of the invention). Connected to a reset input 89 of the register 86 is a clear pulse shaper 90 whose input 91 is connected to an output 92 of a comparison circuit 93. The output 92 is also connected to second inputs 94 of the AND gates 84. The first inputs of the comparison circuit 93 are connected to the address outputs of the selector 7, while second inputs 95 are coupled to outputs of a unit 96 for setting the address of high-voltage valve thyristors under test.

Figure 4:
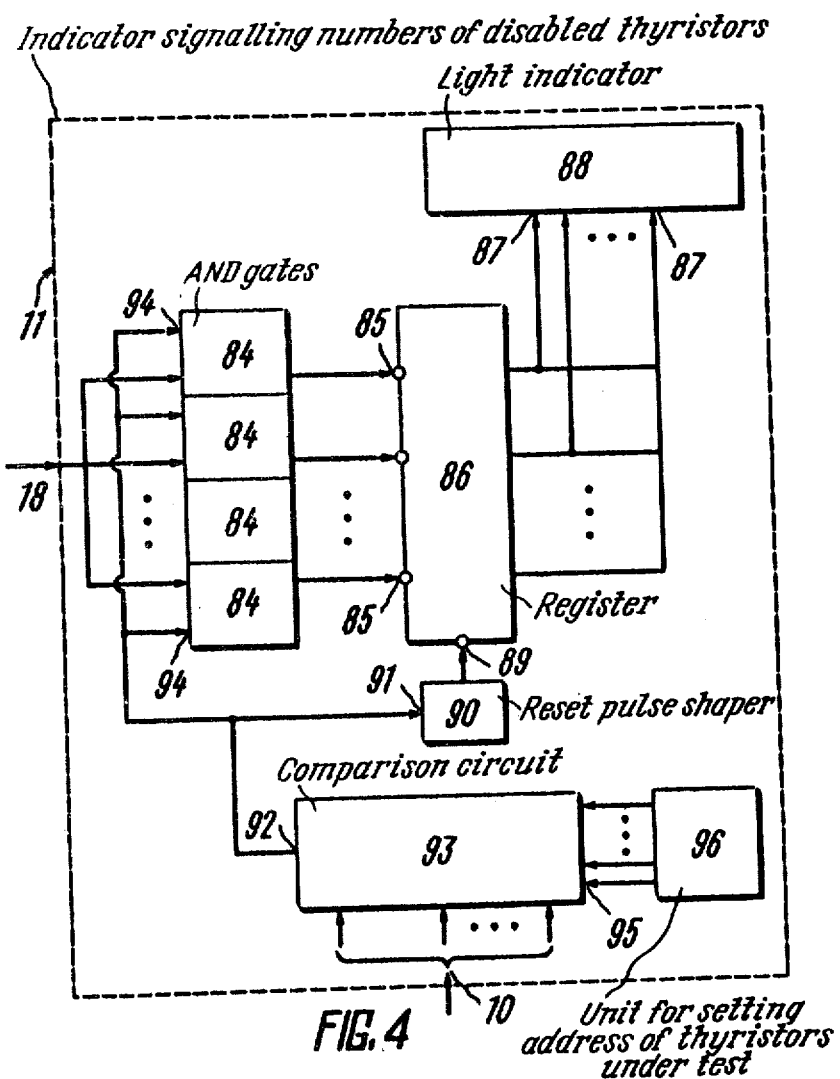
FIG. 4 is a block diagram of an indicator signalling numbers of disabled thyristors in the device according to the invention.

To convey information on disabled thyristors over a coupling channel to the computer, the indicator 11 signalling the numbers of disabled thyristors incorporates additional units (not shown in FIG. 4). The latter feature is not covered by the appended claims and will not, therefore, be discussed in detail.

The control unit 9 (FIG. 1) contains a clock pulse shaper 97 which, in turn, includes a pulse generator 98 and four frequency dividers 99, 100, 101, and 102 representing binary counters with count modules 10, 10, 4 and 9, and placed in series with the binary-decimal decoders.

The output of the generator 98 is connected to an input 103 of a NOT gate 104, to an input 105 of a delay element 106, and to the input of the frequency divider 99. The one-channel output of the frequency divider 99 is connected to the input of the divider 100, to an input 107 of a NOT gate 108, and to first inputs 109 and 110 of AND gates 111, and 112, respectively. A second input 113 of the AND gate 111 is connected to the output of the NOT gate 104, while a second input 114 of the AND gate 112 is coupled to the output of the delay element 106.

The one-channel outputs of the frequency dividers 100 and 101 are connected to the inputs of the dividers 101 and 102, respectively. A multi-channel output 115 of the frequency divider 100 is connected to first inputs 116 of a group of AND gates 117, second inputs 118 of which are connected to the output of the NOT gate 108. Outputs 119 and 120 of the AND gates 111 and 112, a multi-channel output 121 of the group of the AND gates, and multi-channel outputs 122, 123 of the frequency dividers 101, 102 are connected to inputs of an address command shaper 124.

The address command shaper 124 represents a set of AND gates accomplishing conjunction of address signals.

Each channel of the multi-channel output 121 of the group of the AND gates 117 is used to pass clock pulses conventionally designated as a1, a2, . . . a9, a0. Similarly, each channel of the multi-channel outputs 122 and 123 of the frequency dividers 101 and 102 is used to pass clock pulses conventionally designated as b1, b2, b3, b4, and c1, c2, c3, . . . c9, c0, respectively.

In order to improve the ability of the device to respond more quickly, it is possible to increase the number of cells of the butter storage unit 13, to simplify the selector 7, to arrange an additional selector between the units 13 and 14 of the OR gate assembly (not shown in FIG. 1).

The hereinproposed device for testing thyristors of a high-voltage valve operates in the following manner.

On application of voltage to the high-voltage valve, the thyristor voltage detectors 1 (FIG. 1) emit light pulses. These pulses are fed via the light guides 2 to the unit 4 converting light signals into electrical signals, wherein the pulses are again converted into electrical signals. If all the thyristors 5 are serviceable, the number of pulses at the output of the unit 4 will equal the numper of the thyristors 5 in the rectifier. If the thyristor 5 is broken down, no pulses are present at the output of the detector 1. From the output of the unit 4 the electrical pulses are fed to the input 6 of the selector 7, the number of these pulses being determined by the number of serviceable thyristors 5. The address input 8 of the selector 7 accepts through twelve buses an address signal from the control unit 9, said signal representing a combination of two pulses a1, a2, a3, ... a8 and b1, b2, b3, b4. Upon receipt of the signal, the group of the thyristors 5 is connected to the buffer storage unit 13. In the preferred embodiment of the invention the number of the thyristors 5 in the group is eight. The same combination of pulses a and b is applied to the input 10 of the indicator 11 signalling the numbers of disabled thyristors.

The input 12 of the buffer storage unit 13 receives a group of set and reset signals, the set signals signalling the broken-down condition of the thyristors 5 of the high-voltage rectifier. These short set signals are written into the register of the buffer storage unit 13. From the output of said unit the above signals are fed through the OR gate assembly 14 to the input 17 of the adder 16 and simultaneously to the data input 18 of the indicator 11 signalling the numbers of disabled thyristors.

The information conveyed as a set of set and reset signals is coded in the combination adder 52. The information supplied from the output of the adder 52 to the input of the code converter 53 represents the number of set signals in the binary code. The operation of the code converter 53 will be described below. The output signals of the code converter 53 are fed to the storage cell 54.

Next, a buffer storage clear signal is applied from the control unit 9 to the input 47 of the unit 13 whereupon the address signal at the input 8 of the selector 7 changes and the recording of data from the second group of thyristors begins. The sum of data obtained in surveying the two groups of thyristors 5 is written into the storage cell 54. The recording is accomplished by the use of the binary-decimal code. After all the groups of the thyristors 5 in the high-voltage rectifier have been surveyed (32 in the preferred embodiment of the invention), a control signal is fed from the output 22 of the control unit 9 to the input 21 of the memory unit 19. Upon receipt of the signal, the number in the binary-decimal code is rewritten from the storage cell 54 into the register of the storage assembly 74 of the unit 19 by means of the selector 73. Thereafter a signal clearing the storage cell 54 is applied from the output 43 of the control unit to the input 48 of the adder 16.

After the obtained information is written into the first register of the storage assembly 74, all the groups of the thyristors 5 in the high-voltage valve are being surveyed repeatedly. The number of disabled thyristors is counted by the storage cell 54 and rewritten into the second register of the storage assembly 74. Next, the third and subsequent registers of the storage assembly 74 are loaded. In the preferred embodiment of the invention the number of registers in the storage assembly 74 is eight.

The successive pulses coming from the multi-channel output 44 of the control unit 9 cause the data stored in the storage assembly 74 to be read out. These pulses are simultaneously fed from the output 28 of the memory unit 28 to the multi-channel address input 27 of the comparison unit 25.

The first pulse transmitted through the first bus to the control input 49 of the memory unit 19 causes the first bits of the registers of the storage assembly 74 to be connected to the multi-channel output 23.

A group of eight set or eight reset signals is applied to the input 24 of the OR gate assembly 14 and from the output of the assembly 14 to the input of the adder 16.

In the case of short-time spurious response of the generators 1 the group of eight signals consists of reset and set signals. A signal coming from the second output of the adder 16 to the input 26 of the comparison unit 25 represents in the binary code the number of set signals at the output 23 of the memory unit 19. If the number of set signals prevails, (constitutes five of eight), the comparison unit 25 transmits, via a bus corresponding to the first bus of the multi-channel input 27, a pulse to the inputs 29 and 31 of the indicator 30 signalling the quantity of disabled thyristors and the unit 32 protecting the high-voltage valve against breakdown.

A logic one signal is written into the first-bit location of the registers of the storage cells (not shown in FIG. 1) of the indicators 30 and the unit 32. Otherwise, if the number of set signals in the first-bit locations of the registers of the storage assembly 74 is equal to or is less than four, a logic zero signal will be written into the first-bit location of the registers of the storage cells of the indicator 30 and the unit 32.

The second pulse transmitted via the second bus from the multi-channel output 44 of the control unit 9 to the multi-channel input 49 of the memory unit 19 causes the second-bit locations of the registers of the storage assembly 74 to be connected to the multi-channel output 23. A group of set and reset signals is applied to the input 24 of the OR gate assembly 14 and from the output of the assembly 14 to the input 17 of the adder 16. A signal applied from the second output of the adder 16 to the input 26 of the comparison unit 25 represents in the binary code the number of set signals at the output 23 of the memory unit 19, i.e., the number of set signals stored in the second-bit locations of eight registers of the storage assembly 74.

If the number of set signals prevails (equals five of eight), the comparison unit 25 transmits, via a bus corresponding to the second bus of the multi-channel input 27, a pulse to the inputs 29 and 31 of the indicator 30 and the unit 32. A logic one signal is written into the second-bit location of the registers of the storage cells of the indicator 30 and the unit 32.

Similarly, with the polling involving the prevailing number of signals, logic one signals are rewritten from all the bit locations of the registers of the storage assembly 74 of the unit 19 into the corresponding bit locations of the registers of the storage cells of the indicator 30 and the unit 32. If the same number is written in the binary-decimal code into the registers of the indicator 30 and the unit 32 (a condition indicating that the registers are serviceable and no failures have occurred in operation), similar data are conveyed to the multi-bit inputs 35 and 34 of the unit 33 for checking recorded information. Still applied from the output of the unit 33 to the input of the protection unit 32 is the signal enabling transmission of the command to turn off the high-voltage valve. The same signal is fed to the input 36 of the control unit 9 whereby a signal clearing the registers of the storage assembly 74 of the unit 19 will be generated.

If the number stored in the register of the protection unit 32 exceeds a predetermined number of the additional thyristors 5 in the rectifier, the protection unit 32 initiates a command to turn off the valve.

The storage cells of the indicator 30 are cleared by applying a signal from the output 46 of the control unit 9 after all the registers of the storage assembly 74 are loaded. If different data are stored in the registers of the storage cells of the indicator 30 and the protection unit 32, the output circuits of the unit 32 are interlocked and no signal comes to the input 36 of the control unit 9. Thus, the control unit 9 will transmit two more times the command to rewrite the data from the registers of the storage assembly 74 into the registers of the storage cells of the indicator 30 and the protection unit 32. Thereafter all the storage cells of the device are cleared, and another cycle of surveying the thyristors 5 in the valve begins.

If the signals at the bit outputs of the registers of the indicator 30 and the protection unit 32 are unequal over a long period, the unit 33 for checking recorded information furnishes a signal indicating that the device is unserviceable The adder 16 (FIG. 2) operates in the following manner.

The information on the condiction of the thyristors 5 in the high-voltage valve is conveyed to the input 17 of the adder 16 as bytes. Each byte conveys conformation on eight thyristors 5. The number of digits in a byte corresponds to the number of disabled thyristors 5. The bytes are successively applied to the input 17. The control pulses from the output 43 of the control unit 9 are simultaneously (or with a certain delay) applied to the first-bit bus of the control input 48 of the adder 16.

As the first group of the thyristors is surveyed, the input 17 receives the first byte, i.e., eight one-bit signals. The first byte is fed to eight one-bit inputs of the combination adder 52. The outputs of said adder develop the binary code of the sum of set signals in the first byte, while the outputs of the code converter 53 produce the binary-decimal code of the same number, which is supplied to the data inputs of the storage cell 54. Before count the number of disabled thyristors, the storage cell 54 is cleared. So, all bits of the multi-bit input 56 of the combination adder 52 are set to zero. Hence, in surveying the first group of thyristors the adder 52 sums up only one-bit signals coming to the eight inputs of the elementary adders 56, 57, and 58. The inputs of the first summation stage $N_1$ accept signals having a weight of one, and the S-outputs of the stage develop signals having the same weight of one, while the P-outputs thereof develop signals having a weight of two. The S-outputs of the adders 56, 57, and 58 develop signals of intermediate sums of unit weight. The first bit of the unknown sum is formed at the S-output of the adder 59.

The second summation stage $N_2$ adds up the signals of the next second bit, i.e., one having a weight of two. The S-output of the adder 60 provides the intermediate sum of the second bit obtained as a result of adding up the signals from the P-outputs of the adders 56, 57, and 58. The adder 61 receives said signal and also the signal from the P-output of the adder 59 and the signal of the second bit of the input 55, the latter signal being equal to zero in surveying the first group of thyristors. The second bit of the unknown sum is formed at the S-output of the adder 61.

The adder 62 develops at its S-output a third-bit signal (i.e., one having a weight of four) of the unknown sum upon receipt of the signals from the P-outputs of the adders 60, 61 and a signal from the third-bit location of the input 55, the latter signal equalling zero in sruveying the first group of thyristors.

The adder 63 develops at its S-output a fourth-bit signal (i.e., one having a weight of eight) of the sum and at its P-output a carry signal having a weight of sixteen. These output signals are generated to conform to the values of the input signals from the P-output of the adder 62 and of the fourth bit of the input 55, the latter signal equalling zero during the survey operation.

In the code converter 53 the binary code of the sum formed at the output of the combination adder 52 is converted into the binary-decimal code. As a count pulse coming to the first-bit location of the input 48 in interrogating each group of thyristors ceases, four lower digits "1, 2, 4, 8" of the sum in the binary-decimal code are written into the J-K flip-flops 64, 65, 66, and 67. The count pulse is applied to the combined count inputs of said flip-flops 64 to 67 and to the second input 71 of the binary-decimal counter 70. During the first survey operation, no zero signal is present at the decimal carry output 68-P10.

The storage cell 54 is preliminary cleared by a signal coming from the two-input OR gate 72. The inputs of said gate receive signals applied from the input 39 and through the bit-two bus of the control input 48.

As the first count pulse from the Q-outputs of the flip-flops 64 to 67 ceases, the multi-bit input 55 receives information as to the number of disabled thyristors counted during the first survey operation in the binary-decimal code which coincides with the binary code in the bits from one to four.

During the second survey operation, the adder 52 determines the sum of defective thyristors in the second group of thyristors and in the first group of thyristors, i.e., the sum of the number of binary signals at the input 17 and the binary number at the input 55. It will then be possible to obtain a number exceeding ten. Thus, a one signal appearing at the output 68-P10 of the code converter 53 will be written in the lower-digit location of the binary-decimal counter 70 after the second count pulse ceases.

In this case, during the third survey operation the adder 52 computes the sum of the number of defective thyristors in the third group of thyristors and the number stored in the flip-flops 64 to 67 as a result of the second survey operation.

Thereafter the adder 16 sums up the numbers at the input 17 and the number stored in the flip-flops 64 to 67 as a result of surveying the previous group of thyristors. After all the groups of thyristors have been surveyed, the summation data applied from the Q-outputs of said flip-flops 64 to 67 and from the outputs of the counter 70 are rewritten into one of the registers of the storage assembly 74.

The comparison unit 25 (FIG. 3) operates in the following manner.

The input of the unit 25 accepts signals representing numbers written in the binary code. The number represents logic ones written into the registers of the storage assembly 74. If this number is equal to or less than four, it represents the amount of false records of logic ones in the register of the storage assembly 74. If the number is equal to or exceeds five, it indicates that the number of false records of logic one signals in the registers equals a difference between eight and the number being compared.

The pulses representing the number in the binary code come to the input 80 of the decoder 79. The pulses appear at those outputs of the decoder 79 whose consecutive numbers 0, 1, 2, ... 9 correspond to the number of the input signal. If the number at the input 26 of the comparison unit 25 is equal to or less than four no pulses arrives at the input 81 of the OR gate 82. If the number at the input 26 of the unit 25 equals or exceeds five, the output pulse of the decoder 79 comes to one of the inputs 81 of the OR gate 82. The output pulse of the OR gate 82 acts as the output pulse of the comparison circuit 76. Thus, the number supplied to the input 26 of the comparison unit 26 is compared with the number four representing the maximum possible number of spurious responses of the voltage generators employing thyristors.

The output pulse of the comparison circuit 76 is applied to the second inputs 83 of the AND gates of the gate assembly 77. When eight bits of the registers of the storage assembly 74 are successively surveyed, the control signal is simultaneously applied to the address input 27 of the unit 25. When the first bits are surveyed, the address signal is applied through the first bus of the input 27. It is fed through the second bus in surveying the second bits, etc. The one address signal is fed to the input 78 of the respective AND gate whose output develops a data pulse coming to the respective bus of the output 28 of the comparison unit 25. Thus, the eight numbers in the binary code stored in the registers of the storage assembly 74 are rewritten into the registers 30 and the unit 32. The use of the unit 25 makes it possible to eliminate false failure of the thyristor voltage detector 1 whereby the correctness of data supplied by the indicator 11 will be confirmed and the operation of the protection unit 32 will be reliable.

The indicator 22 (FIG. 4) signalling the numbers of disabled thyristors operates in the following manner.

The operator uses the setting unit 96 to set the address of the surveyed group of thyristors. As this happens, two logic signals are applied to two of the twelve buses of the input 95 of the comparison circuit 93. The input 10 of the indicator 11 receives address signals of all groups of thyristors of the high-voltage valve, said address signals being applied from the control unit 11 through the selector 7. As the address signals are made coincident at the inputs of the comparison circuit 93, its output 92 develops a set pulse. Said pulse is applied to the input 91 of the clear pulse shaper 90 furnishing a short reset signal to the input 89 of the register 86. The same pulse is simultaneously applied to the second inputs of the AND gates 84. When the given group of thyristors is surveyed, the input 18 of the indicator 11 receives information on the condition of the thyristors 5 in the group via eight buses. This information represents logic zero and logic one signals. If any thyristor in the group fails, a logic one pulse is fed via a respective bus to the input 18 of the indicator 11 and to the first input of the respective AND gate 84. From the output of said AND gate 84 the pulse is fed to the input 85 of the register 86. The register 86 stores the information supplied to the input 18 as a combination of set and reset signals indicating condition of thyristors of the group whose address has been set by the setting unit 96.

From the output of the register 86 long pulses are applied to the inputs 87 of the indicator 88 which is used to provide visual presentation of the condition of the thyristors in the given group.

The control unit 9 (FIG. 1) operates in the following manner.

The clock pulse generator 98 is a balanced multivibrator generating g-pulses coming to the input of the frequency divider 99. The output of the frequency divider 99 develops pulses $\alpha$ at the first intermediate frequency, relative duration of which corresponds to the count module of the binary counter of the given divider 99, which equals ten. The pulse $\alpha$ duration is equal to the operating period of the generator 98. The NOT gate 104 and the AND gate 111 are used to generate a pulse whose leading edge coincides with the leading edge of the output pulse of the frequency divider, while its duration equals half of the duration of the same pulse. This pulse is used to generate a count command for the storage cells 54 of the adder 16.

The AND gate 112 furnishes a pulse whose trailing edge coincides with the trailing edge of the output pulse of the frequency divider 99, while its duration equals half of the duration of the same pulse excluding the delay of the leading edge by the use of the delay element 106. This pulse is used to generate a command to clear the buffer storage unit 13. The multi-channel output 115 of the divider 100 develops pulses at the second intermediate frequency. These pulses are fed to the first input 116 of the group 117 of AND gates, the second input of which accepts an inverted signal $\bar{\alpha}$ from the input of the divider 100. This decreases the duration of output pulses coming from the output of the divider 100. These pulses are used to generate clock logic one signals for surveying the groups of thyristors.

As the next clock pulse interrogating any group of thyristors ceases, there appears a pulse generating the count command. After a certain delay required to complete the count operation, there appears a pulse generating the command to clear the buffer storage unit 13 whereupon a new clock signal to interrogate the next group of thyristors is applied. The pulses derived from the one-channel output of the divider 100 are applied to the input of the divider 101 whose multi-channel output 102 develops pulses at the third intermediate frequency. These pulses are fed to the input of the address command shaper 124 and are used to produce clock pulses b.

The pulses derived from the one-channel output of the divider 101 are applied to the input of the divider 102 whose multi-channel output 123 develops low-frequency pulses used to generate clock signals c.

The shaper 124 accomplishes conjunction of the aforesaid signals whereby appropriate commands will be transmitted to the various components of the device.

The following commands are applied to the input 8 of the selector 7 and through said input to the input 10 of the indicator 11:

$$(c1+c2+x3+ \ldots +x8)\cdot(b1+b2+b3+b4)\cdot(a1+a2+a3 \ldots a8).$$

Applied from the output 42 of the control unit 9 with a delay is the command $\bar{\alpha}\cdot g$. The commands applied from the output 43 to the input 48 pass two buses. These commands are as follows: the count command $\bar{\alpha}\cdot g$ and the clear command of the form $(c1+c2+c3+ \ldots +c8)\cdot b4\cdot a0$. The following commands are applied from the output 22 to the input 21 of the unit 19: $(c1+x2x3+ \ldots +c8)\cdot b4\cdot a9$. The following commands are applied from the output 44 to the input 49 of the unit 19:

$$c9\cdot b1\cdot(a2+a3+a4+ \ldots a9);$$

$$c9\cdot b2\cdot(a2+a3+a4+ \ldots a9);$$

$$c9\cdot b3\cdot(a2+a3+a4+ \ldots a9).$$

The following clear commands are applied from the output 45 to the input 50: $c9\cdot b4\cdot a9$; $c9\cdot(b1+b2+b3)\cdot a1$. The following commands are applied from the output 41 to the input 40 of the unit 19:

$K\cdot c9\cdot(b1+b2+b3)\cdot a0$. The check command K is applied to the input 36. The following command is applied from the output 46 to the input 51 of the indicator 30: $c9 \cdot (b1+b2+b3) \cdot a1$.

What is claimed is:

1. A device for monitoring thyristors of a high-voltage valve, comprising the following components:
    thyristor voltage detectors having outputs, the number of said detectors corresponding to the number of thyristors;
    light guides whose number corresponds to the number of said detectors, one end of each light guide being connected to the respective voltage detector;
    a unit converting light signals into electrical signals, which has a group of inputs connected to second ends of said light guides, and an output;
    a selector having a data input connected to said output of said unit converting light signals into electrical signals, said selector also having an address input and first and second outputs;
    a buffer storage unit having an input connected to said first output of said selector, a reset input, and an output;
    an OR gate assembly having a first input connected to said output of said buffer storage unit, a second input, and an output;
    an indicator signalling the numbers of disabled thyristors having an address input connected to said second output of said selector, and a data input connected to said output of said OR gate assembly;
    an adder having an input connected to said output of said OR gate assembly, a control unit, first and second outputs;
    a memory unit having a first input connected to said first output of said adder, a second input, a reset input, a control input, an output connected to said second input of said OR gate assembly, and an address read output;
    a comparison unit having a first input connected to said address read output of said memory unit, a second input connected to said second output of said adder, and an output;
    an indicator signalling the quantity of disabled thyristors having an input connected to said output of said comparison unit, a reset input, and an output; and
    a unit protecting the high-voltage valve against breakdown, said protecting unit having (i) an input connected to said output of said comparison unit, (ii) a second input, (iii) a reset input, and (iv) an output;
    a control unit having eight outputs and a control input and connected via said first output to said address input of said selector, via said second output to said reset input of said buffer storage unit, via said third output to said control input of said adder, via said fourth output to said second input of said memory unit, via said fifth output to said control input of said memory unit, via said sixth output to said reset input of said memory unit, via said seventh output to said reset input of said unit protecting the high-voltage valve against breakdown, and via said eighth output to said reset input of said indicator signalling the quantity of disabled thyristors.

2. A device for monitoring thyristors as claimed in claim 1, which includes a unit for checking recorded information that has a first input connected to said output of said indicator signalling the quantity of disabled thyristors, a second input connected to said output of said unit protecting the high-voltage valve against breakdown, and an output connected to said second input of said unit protecting the high-voltage valve against breakdown and to said control input of said control unit.

3. A device for monitoring thyristors as claimed in claim 1, which comprises:
    an additional comparison unit having an input, and an output;
    a third output of said adder connected to said input of said additional comparison unit;
    a reset input of said adder connected to said output of said additional comparison unit.

4. A device for monitoring thyristors as claimed in claim 1, wherein said adder includes:
    a combination adder having N stages;
    a series of main and additional elementary adders forming said stages and having n inputs serving as one-bit inputs of said combination adder;
    S-outputs of said main and additional adders of the first stage $N_1$ connected to said inputs of said additional elementary adders of the same stage;
    one said S-output of said additional adder of each said stage acting as the output of said combination adder;
    a P-output of each said stage and a subsequent stage connected to inputs of said elementary adders of the next stage;
    the last said stage including one elementary adder having P- and S-outputs acting as outputs of said combination adder;
    a code converter having inputs connected to said outputs of said combination adder, paraphase outputs, and a carry output;
    a storage cell containing flip-flops whose number corresponds to the number of said stages, said flip-flops having J- and K-inputs connected to said paraphase outputs of said code converter, C-outputs acting as a control input of said adder, and Q-outputs connected to said input of said elementary adder of the stage corresponding to the bit of said flip-flop and serving as the output of said adder;
    a counter having a first count input connected to said carry output of said code converter, a second count input combined with said C-inputs of said flip-flops, and outputs serving as the outputs of said adder;
    an OR gate having a first input connected to said output of said control unit, and a second input connected to said output of said comparison unit, and an output connected to said reset inputs of said flip-flops and to said input of said counter.

5. A device for monitoring thyristors as claimed in claim 2, wherein the memory unit includes:
    a write selector having a first input serving as said first input of said memory unit, a second input acting as said second input of said memory unit, and an output;
    a memory unit having a first input connected to said output of said write selector, a second input serving as a reset input of said memory unit, and an output;
    a read selector having a first input connected to said output of said storage assembly, a second input serving as said control input of said memory unit, a first output acting as said address output of said memory unit, and a second output serving as said output of said memory unit.

6. A device for monitoring thyristors as claimed in claim 2, wherein said comparison unit includes:
- a comparison circuit having an input acting as said second input of said comparison unit, and an output;
- an OR gate assembly having a first input serving as said first input of said AND gates connected to said address read output of said memory unit, a second input serving as a second input of said AND gates connected to said output of said comparison circuit, and an output acting as said output of said comparison unit.

7. A device for monitoring thyristors as claimed in claim 2, wherein said indicator signalling the numbers of disabled thyristors includes:
- a group of AND gates having a group of first inputs serving as a data input of said indicator signalling the numbers of said thyristors, a group of second inputs, and a group of outputs;
- a register having a group of inputs connected to said group of outputs of said group of AND gates, a reset input, and a group of outputs;
- a light indicator having a group of inputs connected to said group of outputs of said register;
- a clear pulse shaper having an input connected to said group of second inputs of said group of AND gates, and an output connected to said reset input of said register;
- a comparison circuit having a group of inputs serving as said address input of said indicator signalling the numbers of disabled thyristors, a second group of inputs and an output connected to said second group of inputs of said group of AND gates;
- a unit for setting the address of thyristors under test, which has a group of outputs connected to said second group of inputs of said comparison circuit.

* * * * *